United States Patent
Iida

(10) Patent No.: US 7,714,402 B2
(45) Date of Patent: May 11, 2010

(54) SOLID-STATE IMAGING DEVICE AND ELECTRONIC APPARATUS USING THE SAME

(75) Inventor: Yoshinori Iida, Tokyo (JP)

(73) Assignee: Kabushiki Kaisha Toshiba, Tokyo (JP)

(*) Notice: Subject to any disclaimer, the term of this patent is extended or adjusted under 35 U.S.C. 154(b) by 155 days.

(21) Appl. No.: 12/040,340

(22) Filed: Feb. 29, 2008

(65) Prior Publication Data

US 2008/0211047 A1 Sep. 4, 2008

(30) Foreign Application Priority Data

Mar. 2, 2007 (JP) ............................ P2007-053356

(51) Int. Cl.
*H01L 31/00* (2006.01)
(52) U.S. Cl. ........................ 257/432; 257/291; 257/292; 257/E31.001
(58) Field of Classification Search ......... 257/290–295, 257/432, E31.001
See application file for complete search history.

(56) References Cited

U.S. PATENT DOCUMENTS 7,166,880 B2 * 1/2007 Merrill et al. ............... 257/294

FOREIGN PATENT DOCUMENTS

JP 6-5827 1/1994

* cited by examiner

*Primary Examiner*—Thinh T Nguyen
(74) *Attorney, Agent, or Firm*—Oblon, Spivak, McClelland, Maier & Neustadt, L.L.P.

(57) ABSTRACT

A solid-state imaging device includes a semiconductor substrate, a first pixel with a green color filter, a second pixel with a blue color filter and a third pixel with a red color filter. The first pixel includes a first area for generating an electric signal by photoelectric conversion, disposed in a first trench that is formed on a surface of the semiconductor substrate, and a first transistor area that outputs the electric signal obtained from the first area. The second pixel includes a second area formed in a flat shape on the surface of the semiconductor substrate, and a second transistor area that outputs the electric signal obtained from the second area. The third pixel includes a third area formed in a flat shape on the surface of the semiconductor substrate, and a third transistor area that outputs the electric signal obtained from the third area.

11 Claims, 8 Drawing Sheets

103: CDS CIRCUIT

SOLID-STATE IMAGING DEVICE AND ELECTRONIC APPARATUS USING THE SAME

The entire disclosure of Japanese Patent Application No. 2007-053356 filed on Mar. 2, 2007 including specification, claims, drawings and abstract is incorporated herein by reference in its entirety.

BACKGROUND OF THE INVENTION

1. Field of the Invention

The present invention relates to a solid-state imaging device in which a light-receiving plane has an embedded photoelectric conversion area.

2. Description of the Related Art

As a result of recent proliferation of digital cameras, camera-equipped portable cellular phones, and the like, demand for a solid-state imaging device has increased. In particular, there is increasing demand for a CMOS solid-state imaging device capable of being manufactured through CMOS processes which are common semiconductor manufacturing processes. In relation to such solid-state imaging devices, further increasing demand exists for further miniaturization and an increase in the number of pixels, and miniaturization of a pixel size has posed an important problem.

However, the amount of light incident on the solid-state imaging device is also decreased in conjunction with miniaturization of the pixel size, which in turn decreases signal charges of the incident light. There is a fear of deterioration of detection sensitivity, a decrease in an signal-to-noise ratio, and the like, which would otherwise be cause by the decrease in signal charges.

In the meantime, the area of a photodiode in the solid-state imaging device is also reduced along with miniaturization of the pixel size, which in turn raises another problem of a decrease in the number of saturated electrons of the photodiode that takes control of the upper limit of a dynamic range.

Since the number of saturated electrons in the photodiode is determined by the number of dopants (the concentration of a dopant) in an n-type dopant region forming the photodiode, the number of saturated electrons can be in principle increased by increasing the concentration of dopant.

Moreover, in order to reduce noise which takes control of the lower limit of the dynamic range, an ordinary image sensor usually uses an embedded photodiode, in which a heavily-doped p-type dopant diffusion layer is formed as a photodiode structure in the vicinity of the surface of a semiconductor, to thus shield the surface. The photodiode of such a structure yields an effect of reducing noise by virtue of the surface shield, as well as exhibiting a considerably-superior characteristic of the ability to transfer electric charges from the photodiode to a charge detection section in a perfect transfer mode by making a design so that a completely depletion occurs when the potential of the photodiode is lower than a channel potential achieved at the time of activation of the transfer transistor, and the ability to completely eliminate a residual image or reset noise, which would otherwise arise when transfer of electric charges from the photodiode is incomplete.

However, increasing the concentration of dopant of the n-type dopant region forming the photodiode with a view toward increasing the number of saturated electrons signifies an increase in the potential for depleting the photodiode, which in turn poses difficulty in realization of perfect transfer. The amount of dopant and a dopant profile—which have been optimized by conditions for perfect transfer—are optimized by means of a channel potential achieved at the time of activation of a transfer transistor, the potential of the depleted photodiode, the depth of the maximum potential section, and the like. Consequently, the number of saturated electrons determined by means of the number of n-type dopants is determined by the surface area of the photodiode, and increasing the surface area of the photodiode cannot be performed.

For the purpose of preventing deterioration of a sensitivity characteristic, which would otherwise be caused in conjunction with a decrease in light-receiving area, and to enhance the charge conversion efficiency of incident light, there is disclosed a technique for forming a V-shaped trench in a light-receiving plane of a light-receiving section of a solid-state imaging device (see; e.g., JP-A-6-5827.)

However, the technique mentioned in JP-A-6-5827 is described in connection with enhancement of conversion efficiency which is achieved by means of repeatedly causing the light incident on the V trench to undergo reflection in the V trench, to thus re-enter the V trench. However, no description is provided in connection with an increase in the number of saturated electrodes of the photodiode which is achieved while a complete transfer mode is maintained, nor is a suggestion thereon described.

Further, in relation to all pixels of a single-panel color imaging device, no consideration is given to deterioration of a device characteristic, which would otherwise be caused by forming a photodiode having a V-shaped trench.

SUMMARY OF THE INVENTION

Accordingly, the invention provides a solid-state imaging device capable of preventing a decrease in detection sensitivity, a decrease in a signal-to-noise ratio, and a decrease in dynamic range, and of lessening noise, which would otherwise be caused along with miniaturization of a pixel size, by having the ability to enhance sensitivity and increase the number of saturated electrons, while maintaining reading of signal charges from a photodiode in a complete transfer mode.

The invention may provide a solid-state imaging device including: a semiconductor substrate; a first pixel formed on the semiconductor substrate, the first pixel having a first color filter that exhibits higher transmissivity to a first visible light wavelength range of a green color than to other visible light wavelength ranges; a second pixel formed on the semiconductor substrate, the second pixel having a second color filter that exhibits higher transmissivity to a second visible light wavelength range of a blue color than to other visible light wavelength ranges; and a third pixel formed on the semiconductor substrate, the third pixel having a third color filter that exhibits higher transmissivity to a third visible light wavelength range of a red color than to other visible light wavelength ranges; wherein the first pixel includes: a first area disposed in a first trench that is formed on a surface of the semiconductor substrate, the first area configured to generate an electric signal by photoelectric conversion, and a first transistor area that outputs the electric signal obtained from the first area as an output signal; the second pixel includes: a second area formed in a flat shape on the surface of the semiconductor substrate, the second area configured to generate an electric signal by photoelectric conversion, and a second transistor area that outputs the electric signal obtained from the second area as an output signal; and the third pixel includes: a third area formed in a flat shape on the surface of the semiconductor substrate, the third area configured to generate an electric signal by photoelectric conversion, and a third transistor area that outputs the electric signal obtained from the third area as an output signal.

BRIEF DESCRIPTION OF THE DRAWINGS

Embodiment may be described in detail with reference to the accompanying drawings, in which.

DETAILED DESCRIPTION OF THE INVENTION

Figure 1:
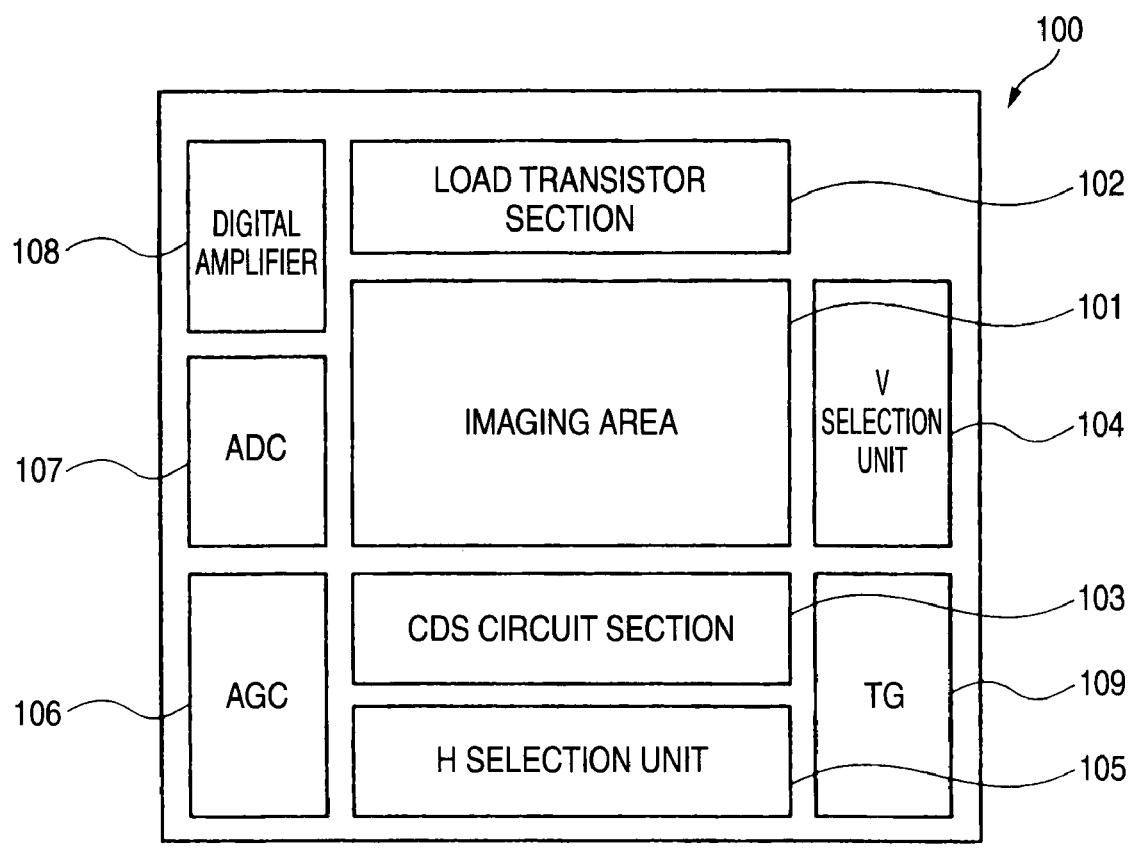
FIG. 1 is a schematic plan view for describing an example chip configuration of a solid-state imaging device of a first embodiment.

Embodiments of the present invention will be described in detail hereunder by reference to the drawings. In the following descriptions about the drawings, like elements are assigned like reference numerals, and their repeated explanations are omitted. The drawings are diagrammatic, and a relationship between a thickness and a two-dimensional size, a proportion of thicknesses of respective layers, and the like, are different from an actual relation and an actual proportion. Further, the drawings also include differences in terms of a dimensional relationship and a proportion.

First Embodiment

An embodiment of the present invention will be described hereunder by reference to the drawings.

FIG. 1 is a schematic plan view for describing an example chip configuration of a solid-state imaging device of a first embodiment.

As shown in FIG. 1, a solid-state imaging device of the present embodiment is provided with an imaging area 101; a load transistor section 102 provided around the imaging area 101; a CDS circuit section 103; V selection unit 104; H selection unit 105; an AGC (Automatic Gain Control) circuit 106; an ADC (A/D converter) 107; a digital amplifier 108; and a TG (Timing Generator) circuit 109.

A plurality of pixels are arranged two-dimensionally (or in a matrix pattern) in the imaging region 101, and the imaging region is classified into a plurality of blocks while a plurality of adjacent pixels are taken as one unit.

Figure 2:
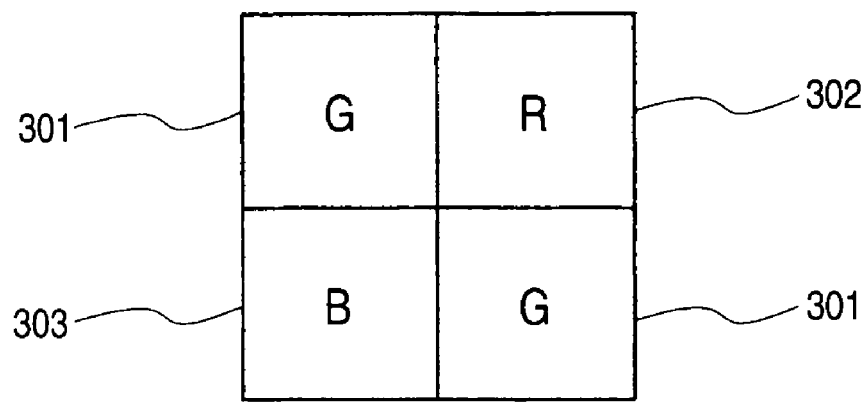
FIG. 2 is a view showing an example pixel block of two lines and two rows of the first embodiment.

For instance, FIG. 2 is a view showing an example pixel block of two lines and two rows of the first embodiment. In the pixel block shown in FIG. 2, pixels 301 having filters for transmitting green light (hereinafter called "G pixels") are arranged in a diagonal pattern, and remaining two pixels are formed from a pixel 302 having a filter for transmitting red light (hereinafter called an "R pixel") and a pixel 303 having a filter for transmitting blue light (hereinafter called a "B pixel").

Figure 3:
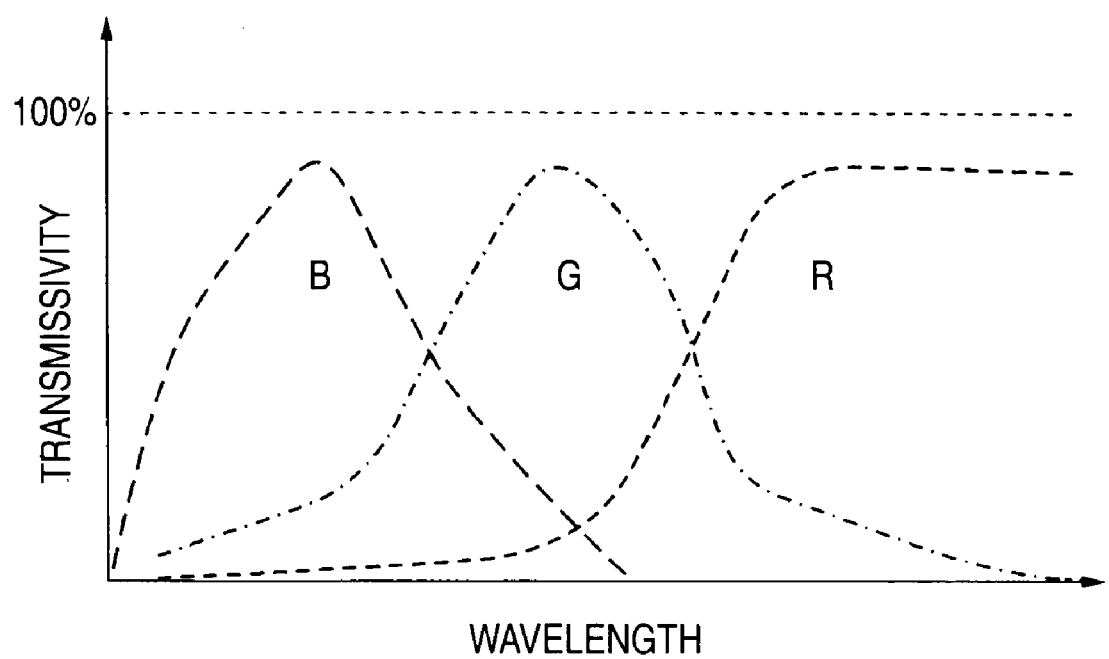
FIG. 3 is a graph showing transmissivity of the color filter.

FIG. 3 is a graph showing transmissivity of the color filter.

As shown in FIG. 3, the color filter of green color G exhibits high transmissivity with respect to light having a visible light wavelength range of about 500 to 550 nm; the color filter of red color R exhibits high transmissivity with respect to light having a visible light wavelength range of about 600 to 700 nm; and the color filter of blue color b exhibits high transmissivity with respect to light having a visible light wavelength range of about 450 to 400 nm.

Figure 4:
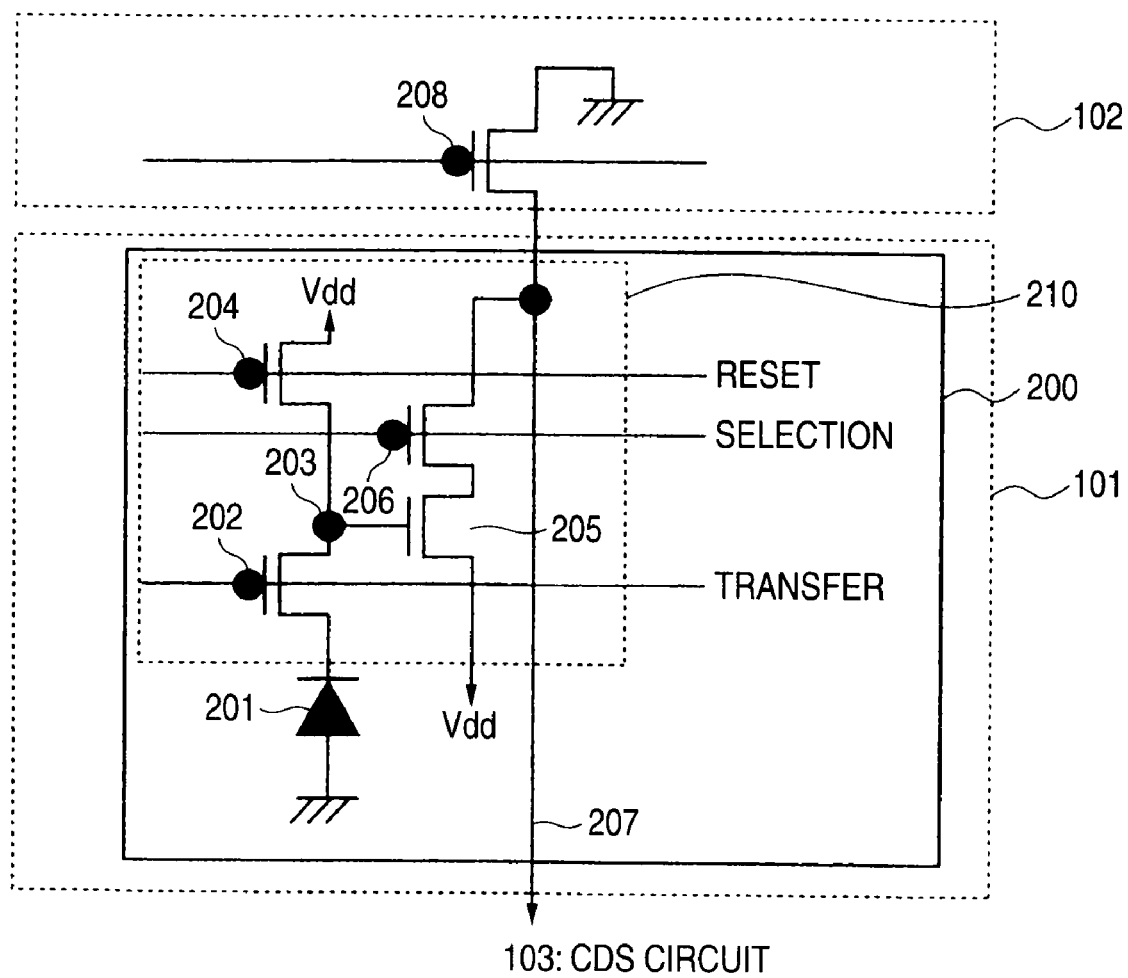
FIG. 4 is a circuit diagram showing a portion of specific configuration of the imaging region 101 and a portion of specific configuration of the load transistor section 102 shown in FIG. 1.

FIG. 4 is a circuit diagram showing a portion of specific configuration of the imaging region 101 and a portion of specific configuration of the load transistor section 102 shown in FIG. 1.

As shown in FIG. 4, a photoelectric conversion pixel 200 provided in the imaging region 101 has a photoelectric conversion area (hereinafter abbreviated simply as "PD") 201 for effecting photoelectric conversion; a transfer transistor 202 connected to the PD 201; a floating diffusion (hereinafter abbreviated simply as "FD") 203 connected to the transfer transistor 202; a reset transistor 204 and an amplifying transistor 205 connected to the transfer transistor 202 by way of the FD 203; and a selection transistor 206 connected in series to the amplifying transistor 205.

More specifically, the PD 201 is formed in a drain region of the transfer transistor 202. The FD 203 is connected to a source of the transfer transistor 202, a drain of the reset transistor 204, and a gate of the amplifying transistor 205. The source of the reset transistor 204 is connected to a Vdd. The drain of the amplifying transistor 205 is connected to the Vdd, and the source of the same is connected to a drain of the selection transistor 206. A source of the selection transistor 206 is connected to a vertical signal line 207.

One end of the vertical signal line 207 is connected to a drain of a load transistor 208 provided in the load transistor section 102, and a source of the load transistor 208 is connected to the ground. The other end of the vertical signal line 207 is connected to an unillustrated CDS circuit 103 located outside of the imaging region 101.

The amplifying transistor 205 and the load transistor 208 vertically connected to the vertical signal line 205 constitute a source follower circuit which outputs a signal voltage developing in the FD 203 to the CDS circuit 103.

The selection transistor 206 connected in series to the amplifying transistor 205 operates as a switch, thereby separating the amplifying transistors 205 of unselected rows from the vertical signal line 207.

In FIG. 4, photoelectric conversion (the PD 201), signal charge storage (the PD 201), qv conversion (the FD 203), and a source-follower circuit (the amplifying transistor 205 and the load transistor 208) are implemented in the photoelectric conversion pixel 200. However, the present invention is not limited to these operations. A plurality of PDs 201 and a plurality of transfer transistors 202 may also be connected, as necessary, to one FD 203, thereby sharing the other reset transistor 204, the amplifying transistor 205, and the selection transistor 206. A two-pixel one-cell configuration, four-pixel one-cell configuration, and the like, may also be possible. Moreover, the amplifying transistor 205 and the selection transistor 206 which are shown in FIG. 4 may also be configured so as to be replaced with each other.

Figure 5:
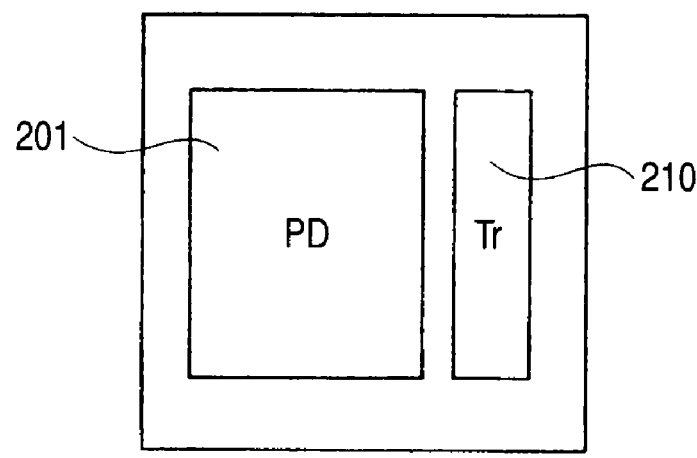
FIG. 5 is a plan view showing an example relationship of internal layout of each pixel.

FIG. 5 is a plan view showing an example relationship of internal layout of each pixel. Detailed wiring, or the like, is omitted from the drawing. A transistor (Tr) region 210 in FIG. 5 designates a transistor area from which an electric signal generated by means of photoelectric conversion performed by the PD 201 is output. In FIG. 4, the transistor area designates an area including portions of the transfer transistor 202, the FD 203, the reset transistor 204, the amplifying transistor 205, the selection transistor 207, and the vertical signal line 207. In the present embodiment, a layout is designed such that the PD 201 occupies the maximum-possible area in the pixel.

Figure 6:
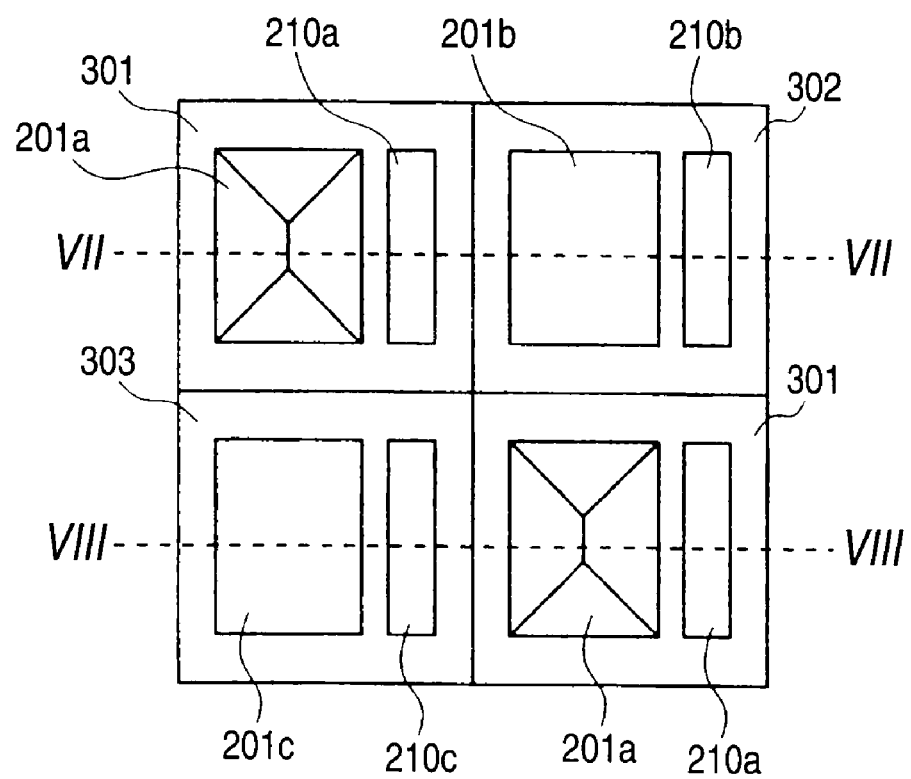
FIG. 6 is a plan view of each pixel of the first embodiment in which the pixel block including two lines and two rows shown in FIG. 2 is taken as an example.
Figure 7:
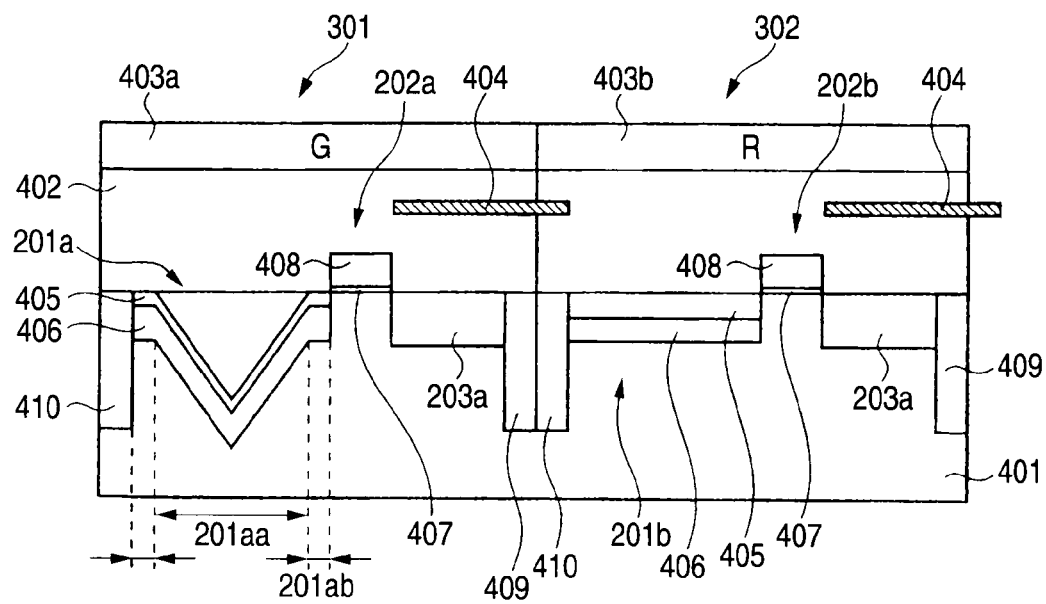
FIG. 7 is a cross-sectional profile taken along line 7-7 shown in FIG. 6.
Figure 8:
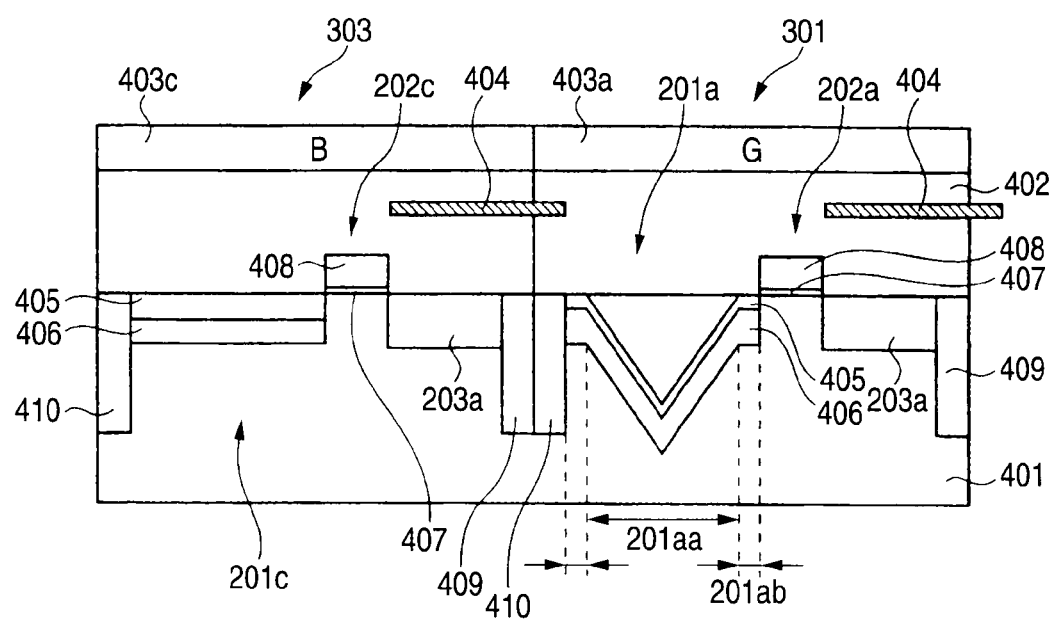
FIG. 8 is a cross-sectional profile taken along line 8-8 shown in FIG. 6.

FIG. 6 is a plan view of each pixel of the first embodiment in which the pixel block including two lines and two rows shown in FIG. 2 is taken as an example. FIG. 7 is a cross-sectional profile taken along line 7-7 shown in FIG. 6. FIG. 8 is a cross-sectional profile taken along line 8-8 shown in FIG. 6. The pixel block which includes two lines and two rows and which is shown in FIG. 6 corresponds to the pixel block 301 (G pixel), the pixel 302 (R pixel), and the pixel 303 (B pixel) shown in FIG. 2.

As shown in FIGS. 6 through 8, each pixel has photoelectric conversion areas 201a, 201b, and 201c formed on a semiconductor substrate 401; transistor areas 210a, 210b, and 210c which are provided adjacent to the photoelectric conversion areas 201a, 201b, and 201c and which output electric signals (electric charges) converted by the photoelectric conversion areas 201a, 201b, and 201c to the outside; an interlayer insulating film 402 laid over the photoelectric conversion areas 201a, 201b, 201c and the transistor areas 210a, 210b, and 210c; and color filters 403a, 403b, and 403c provided on the interlayer insulating film 402. A light-shielding film 404 for blocking light to an adjacent pixel is provided in the interlayer insulating film 402.

The color filter 403a provided for the G pixel 301 exhibits high transmissivity with respect to light of green color G (a wavelength of about 500 to 550 nm) The color filter 403b provided for the R pixel 302 exhibits high transmissivity with respect to light of the red color R (a wavelength of about 600 to 700 nm). The color filter 403c provided for the B pixel 303 exhibits high transmissivity with respect to light of the blue color B (a wavelength of about 450 to 490 nm).

The photoelectric conversion areas 201a, 201b, and 201c have sensitivity up to a near-infrared wavelength which is not sensed by the human eye, and hence it may arise the case where color reproducibility will be deteriorated unless near-infrared light (of: e.g., 650 nm or more) is cut. For instance, when a subject emitting (reflecting) pure green light and near-infrared light is subjected to image pickup, the G pixel detects green light, and the R pixel detects near-infrared light. It becomes impossible to detect the subject as a pure green color (R:G:B)=(0:1:0). For this reason, an infrared-radiation cut filter for blocking light of 650 nm or more may also be interposed between the interlayer insulating film 402 and the color filters 403a, 403b, and 403c or over the color filters 403a, 403b, and 403c (not shown).

As a matter of course, the effect can be yielded even when the IR cut filter is not formed within the solid-state imaging device chip, so long as the IR cut filter is placed in an optical path extending from the subject, an imaging optical system, and the solid-state imaging device.

The configuration of each pixel will be described hereunder in more detail.

A specific configuration will now be described by means of the cross-sectional profiles shown in FIGS. 7 and 8. Since a related-art configuration is applied to the other transistors (the FD 203, the rest transistor 204, the amplifying transistor 205, and the selection transistor 206) in the transistor area 210 which cannot be described by reference to FIGS. 7 and 8, their explanations are omitted.

The G pixel 301 of the solid-state imaging device of the present embodiment has the photoelectric conversion area 201a.

The photoelectric conversion area 201a has a first photoelectric conversion area 201aa having the form of V-shaped trench formed in the semiconductor substrate 401; and a second photoelectric conversion area 201ab which is proximate to the first photoelectric conversion area 201aa, which is provided in the same layer where the first photoelectric conversion area 201aa is provided, and which has a flat shape with respect to a surface of the semiconductor substrate 401. The word "same layer" used herein means that an entire layer is formed integrally as a single layer on the substrate.

Each of the first photoelectric conversion area 201aa and the second photoelectric conversion area 201ab has p-type conductivity. For instance, the first photoelectric conversion area 201aa and the second photoelectric conversion area 201ab each are formed from a multilayer structure including have a p-type semiconductor region 405 (hereinafter called simply "p-type region") which exhibits p-type conductivity and which is provided in the vicinity of the surface of the semiconductor substrate 401 formed from Si and an embedded n-type semiconductor region 406 (hereinafter called simply "n-type region") which exhibits n-type conductivity and which is provided below the p-type region 405.

The transfer transistor 202a is provided adjacently to the photoelectric conversion area 201a. The transfer transistor 202a has a gate insulating film 407 which takes a portion of the second photoelectric conversion area 201ab as a drain and which is provided adjacently to the second photoelectric conversion area 201ab; a gate electrode 408 provided on the gate insulating film 407; and the dopant diffusion area 203a sharing a portion of the drain of the FD 203.

Figure 9:
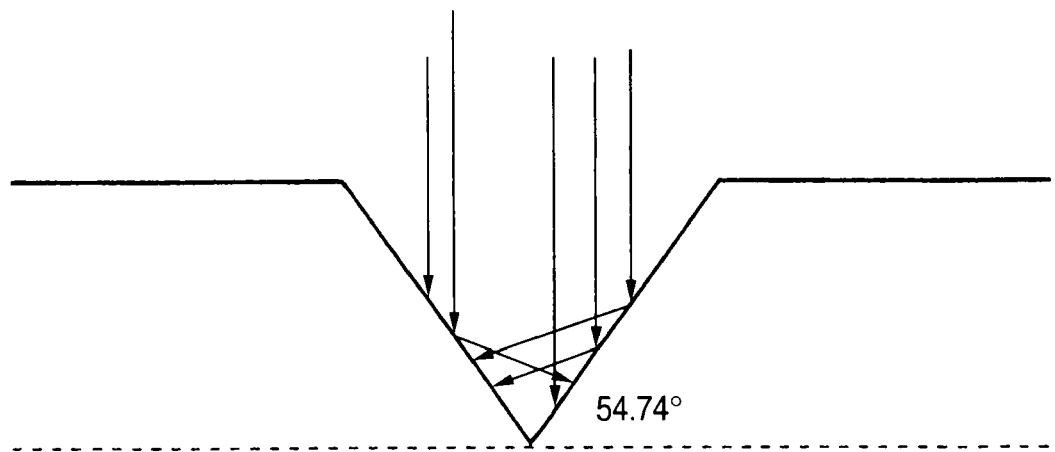
FIG. 9 is a conceptual rendering for describing a path for light incident on a first photoelectric conversion area.

The color filter 403a first permits transmission of light of the green color G of the light incident on the G pixel 301, and the green light enters the photoelectric conversion area 201a. At this time, the first photoelectric conversion area 201aa has the form of the V-shaped trench formed in the semiconductor substrate 401. Hence, as shown in FIG. 9, the light of green color G having passed through the color filer 403a is absorbed directly, or the light of green color G having undergone reflection on the surface of the V-shaped trench is absorbed indirectly. A signal electron is generated in accordance with the amount of light of the green color G absorbed by the first photoelectric conversion area 201aa, and the thus-generated signal electron is stored in the first photoelectric conversion area 201aa and the second photoelectric conversion area 201ab. Further, the second photoelectric conversion area 201ab also directly absorbs the light of the green color G having passed through the color filter 403a. Likewise, a signal electron is generated in accordance with the amount of light of the green color G absorbed by the second photoelectric conversion area 201ab, and the thus-generated electron is stored in the first photoelectric conversion area 201aa and the second photoelectric conversion area 201ab. The signal electron stored in the first photoelectric conversion area 201aa and the second photoelectric conversion area 201*ab* is output to the FD 203 as a result of the gate electrode 408 being turned on.

The photoelectric conversion area 201*a* of the G pixel of the present embodiment has the first photoelectric conversion area 201*aa* having the form of the V-shaped trench and the second photoelectric conversion area 201*ab* having a flat structure with respect to the surface of the semiconductor substrate 401. Therefore, the photoelectric conversion area 201*a* can absorb the light—which has been reflected by the first surface of the first photoelectric conversion area 201*aa*—by means of the second surface of the first photoelectric conversion area 201*aa*. Consequently, the signal electron increases, and a high sensitivity characteristic can be achieved.

Since the second photoelectric conversion area 201*ab* is provided in the same layer where the first photoelectric conversion area 201*aa* is provided, transfer of signal electrons developing from the respective areas to the transfer transistor 202*a* is performed by means of a potential profile structure analogous to that of the photoelectric conversion areas 201*b* and 201*c* of an R pixel 301 and a B pixel 303, which will be described later. Therefore, the signal electrons can be completely transferred from the photodiode without paying special attention to the form of the V-shaped trench.

Moreover, a dopant profile of the n-type dopant region of the photoelectric conversion area 201*aa* having the form of a V-shaped trench and a dopant profile of the second photoelectric conversion area 201*ab* having a flat structure with respect to the surface of the semiconductor substrate 401 can be controlled independently of each other. A peak concentration of the n-type dopant area of the first photoelectric conversion area 201*aa* is set so as to become lower than the peak concentration of the n-type dopant region of the second photoelectric conversion area 201*ab*, whereby signal charges are completely transferred from the first photoelectric conversion area 201*aa* to the second photoelectric conversion area 201*ab*. Further, the depth of the peak concentration of the n-type dopant region of the first photoelectric conversion area 201*aa* is set so as to become greater than the depth of the peak concentration of the n-type dopant region of the second photoelectric conversion area 201*ab*, whereby the total amount of dopant of the first photoelectric conversion area 201*aa* can be made greater than the total amount of dopant of the second photoelectric conversion area 201*ab*. Consequently, a wide dynamic range characteristic involving a large a number of saturated electrons can be obtained.

The R pixel 302 of the solid-state imaging device of the present embodiment has the photoelectric conversion area 201*b*.

The photoelectric conversion area 201*b* is formed from a multilayer structure including a p-type region 405 which has a flat shape with respect to the surface of the semiconductor substrate 401 and which is provided at a position in the vicinity of the surface of the semiconductor substrate 401; and an n-type region 406 provided beneath the p-type region 405.

The transfer transistor 202*b* is provided adjacently to the photoelectric conversion area 201*b*. The transfer transistor 202*b* has the gate insulating film 407 which takes a portion of the photoelectric conversion area 201*b* as a drain and which is provided adjacently to the photoelectric conversion area 201*b*; the gate electrode 408 provided on the gate insulating film 407; and the dopant diffusion area 203*a* sharing a portion of the drain of the FD 203.

The color filter 403*b* first permits transmission of light of the red color R of the light incident on the R pixel 302, and the red light enters the photoelectric conversion area 201*b*. The photoelectric conversion area 201*b* directly absorbs the light of the red color having passed through the color filter 403*b*. In accordance with the amount of light of the red color R absorbed by the photoelectric conversion area 201*b*, a signal electron is generated, and the thus-generated signal electron is stored in the photoelectric conversion area 201*b*. The signal electron stored in the photoelectric conversion area 201*b* is output to the FD 203 as a result of activation of the gate electrode 408.

The B pixel 303 of the solid-state imaging device of the present embodiment has the photoelectric conversion area 201*c*.

The photoelectric conversion area 201*c* is formed from a multilayer structure including the p-type region 405 which has a flat shape with respect to the surface of the semiconductor substrate 401 and which is provided at a position in the vicinity of the surface of the semiconductor substrate 401; and the n-type region 406 provided beneath the p-type region 405.

The transfer transistor 202*c* is provided adjacently to the photoelectric conversion area 201*c*. The transfer transistor 202*c* has the gate insulating film 407 which takes a portion of the photoelectric conversion area 201*c* as a drain and which is provided adjacently to the photoelectric conversion area 201*c*; the gate electrode 408 provided on the gate insulating film 407; and the dopant diffusion area 203*a* sharing a portion of the drain of the FD 203.

The color filter 403*c* first permits transmission of light of the blue color B of the light incident on the B pixel 303, and the blue light enters the photoelectric conversion area 201*c*. The photoelectric conversion area 201*c* directly absorbs the light of the blue color having passed through the color filter 403*c*. In accordance with the amount of light of the blue color B absorbed by the photoelectric conversion area 201*c*, a signal electron is generated, and the thus-generated signal electron is stored in the photoelectric conversion area 201*c*. The signal electron stored in the photoelectric conversion area 201*c* is output to the FD 203 as a result of activation of the gate electrode 408.

The element isolation regions 409 and the heavily-doped p-type regions (hereinafter called "p+ regions") 410 including in high concentrations dopants exhibiting p-type conductivity are provided among the G pixel 301, the R pixel 302, and the B pixel 303. More specifically, the element isolation region 409 is provided from the surface of the semiconductor substrate 401 to a front layer area at a position between the FD 203 and the photoelectric conversion area of an adjacent pixel. The p+ area 410 is provided from the surface of the semiconductor substrate 401 to the front layer area at a position between the element isolation region 409 and the photoelectric conversion area of an adjacent pixel, so as to become adjacent to the element isolation region 409.

This element isolation region 409 is formed from; e.g., an embedded oxide film formed from $SiO_2$, and electrically isolates the elements from each other.

The p+ regions 410 are provided for attaining a low dark current characteristic (a low noise characteristic), by means of spatially separating a depletion layer formed in the photoelectric conversion area in order to store signal charges and the element isolation region 409, to thus prevent arrival of a dark current (noise electrons) thermally developing in an $SiO_2$—Si interface state at the depletion layer in the photoelectric conversion area.

As mentioned above, in the solid-state imaging device of the present embodiment, the photoelectric conversion area 201*a* in the G pixel 301 assumes the form of the V-shaped trench. As shown in FIG. 9, the V-shaped trench of the photoelectric conversion area 201a makes an angle of about 54.74° with respect to the surface of the semiconductor substrate 401. The V-shaped trench can be readily formed by means of anisotropically etching the surface of the semiconductor substrate whose plane direction is {100} through use of alkaline etchant, such as TMAH.

In the case of the G pixel 301, the p-type region 405 and the n-type region 406 are formed in the photoelectric conversion areas 201a, 201b, and 201c by means of etching the surface of the semiconductor substrate whose plane orientation is {100} through use of TMAH, to thus form the V-shaped trenches, and subjecting the V-shaped trenches to ion implantation. In the case of the R pixel 302 and the B pixel 303, the p-type region 405 and the n-type region 406 can be formed by means of implanting ions directly into the surface of the semiconductor substrate 401.

As mentioned above, the solid-state imaging device of the present embodiment aims at enhancing sensitivity to light incident on the G pixel—which exhibits highest sensitivity in connection with visual sensitivity of the human eye and which is most easily saturated—and increasing the number of saturated electrons, by means of forming the photoelectric conversion area 201a of the G pixel 301 from the first photoelectric conversion area 201aa formed into the form of the V-shaped trench and the second photoelectric conversion area 201ab having the flat structure with respect to the surface of the semiconductor substrate 401. About one-half of a brightness signal of the solid-state imaging device is generally controlled by a signal component from the G pixel. Therefore, a decrease in the number of saturated electrons of the photodiode that take control of the upper limit of the dynamic range, which would otherwise be caused by a reduction in pixel size, can be prevented by means of enhancing sensitivity detected by the G pixel and increasing the number of saturated electrons. Moreover, since the number of saturated electrons can be increased while complete transfer of the signal electrons read from the photodiode is maintained as mentioned above, a low noise characteristic is maintained, and deterioration of detection sensitivity, a decrease in the signal-to-noise ratio, a decrease in dynamic range, and occurrence of noise, which would otherwise be caused as a result of miniaturization of the pixel size, can be prevented.

A peak value of dopant concentration of the second photoelectric conversion area 201ab of the G pixel 301 is preferably higher than the peak value of dopant concentration of the first photoelectric conversion area 201aa. Further, a dopant concentration of the second photoelectric conversion area 201ab preferably corresponds to a dopant concentration at which there is obtained an electric potential that is lower than a channel potential achieved at the time of activation of the transfer transistor.

More specifically, a peak value of dopant concentration of the p-type region 405 of the second photoelectric conversion area 201ab is preferably higher than a peak value of dopant concentration of the p-type region 405 of the first photoelectric conversion region 201aa. A peak value of dopant concentration of the n-type region 406 of the second photoelectric conversion area 201ab is preferably higher than a peak value of dopant concentration of the n-type region 406 of the first photoelectric conversion area 201aa. The dopant concentration of the p-type region 405 and the dopant concentration of the n-type region 406 of the second photoelectric conversion area 201a preferably correspond to a dopant concentration at which there is obtained an electric potential that is lower than a channel potential achieved at the time of activation of the transfer transistor.

As mentioned above, when the peak value of the dopant concentration of the second photoelectric conversion area 201ab in the G pixel is higher than the peak value of the dopant concentration of the first photoelectric conversion area 201aa, a potential barrier against transfer of signal charges from the first photoelectric conversion area 201aa to the second photoelectric conversion area 201ab is not formed, so that perfect transfer of signal charges can be maintained. Moreover, the total amount of dopant in the n-type dopant area of the second photoelectric conversion area 201ab can be designed so as to become greater than the total amount of dopant in the n-type dopant area in the first photoelectric conversion area 201aa. Hence, the total amount of dopant taking control of the number of saturated electrons can be increased. Consequently, extension of the dynamic range or prevention of a decrease in dynamic range, which would otherwise be caused as a result of miniaturization, can also be attained by means of an increase in the number of saturated electrons.

Although the cross-sectional profiles shown in FIGS. 7 and 8 do not illustrate light condensing lenses to be provided on the respective color filters 403a, 403b, and 403c, unillustrated light-condensing lenses for converging light onto the photoelectric conversion areas 201a, 201b, and 201c may also be provided.

Second Embodiment

A second embodiment of the present invention will now be described by reference to the drawings.

Figure 10:
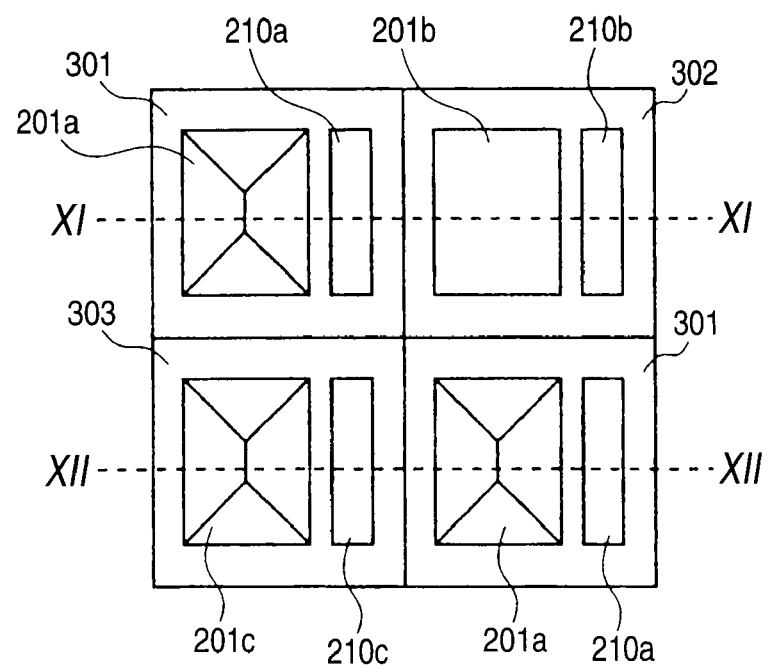
FIG. 10 is a plan view of each pixel of a second embodiment in which a pixel block including two lines and two rows is taken as an example.
Figure 11:
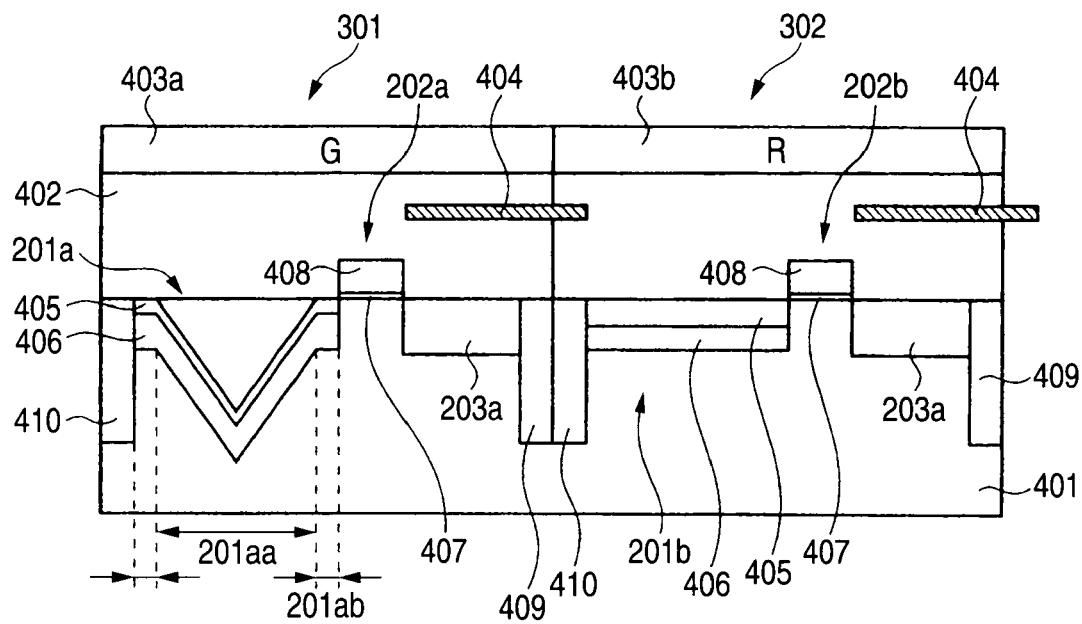
FIG. 11 is a cross-sectional profile taken along line C-C shown in FIG. 10.
Figure 12:
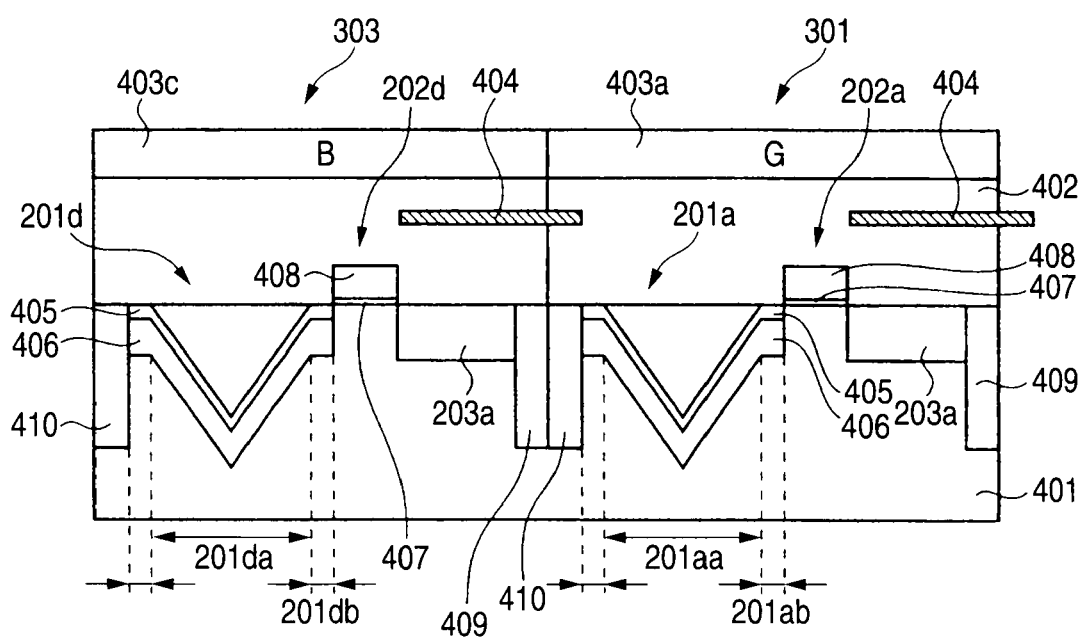
FIG. 12 is a cross-sectional profile taken along line D-D shown in FIG. 10.

FIG. 10 is a plan view of each pixel of a second embodiment which takes, as an example, a pixel block including two lines and two roes. FIG. 11 is a cross-sectional profile taken along line C-C shown in FIG. 10, and FIG. 12 is a cross-sectional profile taken along line D-D shown in FIG. 10.

In a solid-state imaging device of the present embodiment, the photoelectric conversion area 201c of the B pixel 303 is replaced with a photoelectric conversion area 201d, and the transfer transistor 202c is replaced with a transfer transistor 202d. In other respects, the solid-state imaging device is analogous to the solid-state imaging device of the first embodiment, and hence their explanations are omitted.

The B pixel 303 of the solid-state imaging device of the present embodiment has the photoelectric conversion area 201d.

The photoelectric conversion area 201d has a first photoelectric conversion area 201da having the form of a v-shaped trench formed in the semiconductor substrate 401; and a second photoelectric conversion area 201db which is proximal to the first photoelectric conversion area 201da and provided in the same layer where the first photoelectric conversion area is provided and which has a flat shape with respect to the surface of the semiconductor substrate 401.

Each of the first photoelectric conversion area 201da and the second photoelectric conversion area 201db has p-type conductivity. For instance, the first photoelectric conversion area 201da and the second photoelectric conversion area 201db each are formed from a multilayer structure including have a p-type semiconductor region 405 which is provided in the vicinity of the surface of the semiconductor substrate 401 formed from Si and an n-type semiconductor region 406 provided below the p-type region 405.

The transfer transistor 202d is provided adjacently to the photoelectric conversion area 201d. The transfer transistor 202d has a gate insulating film 407 which takes a portion of the second photoelectric conversion area 201db as a drain and which is provided adjacently to the second photoelectric conversion area 201db; the gate electrode 408 provided on the gate insulating film 407; and the dopant diffusion area 203a sharing a portion of the drain of the FD 203.

As in the case of the G pixel 301 described in connection with the first embodiment, the color filter 403c first permits transmission of light of the blue color B of the light incident on the B pixel 303, and the blue light enters the photoelectric conversion area 201d. At this time, the first photoelectric conversion area 201da has the form of the V-shaped trench formed in the semiconductor substrate 401. Hence, as shown in FIG. 9, the light of blue color B having passed through the color filer 403c is absorbed directly, or the light of blue color B having undergone reflection on the surface of the V-shaped trench is absorbed indirectly. A signal electron is generated in accordance with the amount of light of the blue color B absorbed by the first photoelectric conversion area 201da, and the thus-generated signal electron is stored in the first photoelectric conversion area 201da and the second photoelectric conversion area 201db. Further, the second photoelectric conversion area 201db also directly absorbs the light of the blue color B having passed through the color filter 403c. Likewise, a signal electron is generated in accordance with the amount of light of the blue color B absorbed by the second photoelectric conversion area 201db, and the thus-generated electron is stored in the first photoelectric conversion area 201da and the second photoelectric conversion area 201db. The signal electron stored in the first photoelectric conversion area 201da and the second photoelectric conversion area 201db is output to the FD 203 as a result of the gate electrode 408 being turned on.

The photoelectric conversion area 201d of the B pixel of the present embodiment also has the first photoelectric conversion area 201da having the form of the V-shaped trench and the second photoelectric conversion area 201db having a flat structure with respect to the surface of the semiconductor substrate 401. Therefore, there can be yielded an effect analogous to that yielded by the G pixel 301 and described in connection with the first embodiment.

As in the case of the G pixel 301, the B pixel of the present embodiment also is preferably formed such that a peak value of dopant concentration of the second photoelectric conversion area 201db is preferably higher than the peak value of dopant concentration of the first photoelectric conversion area 201da. Further, a dopant concentration of the second photoelectric conversion area 201db preferably corresponds to a dopant concentration at which there is obtained an electric potential that is lower than a channel potential achieved at the time of activation of the transfer transistor.

More specifically, a peak value of dopant concentration of the p-type region 405 of the second photoelectric conversion area 201db is preferably higher than a peak value of dopant concentration of the p-type region 405 of the first photoelectric conversion region 201da. A peak value of dopant concentration of the n-type region 406 of the second photoelectric conversion area 201db is preferably higher than a peak value of dopant concentration of then-type region 406 of the first photoelectric conversion area 201da. The dopant concentration of the p-type region 405 and the dopant concentration of the n-type region 406 of the second photoelectric conversion area 201d preferably correspond to a dopant concentration at which there is obtained an electric potential that is lower than a channel potential achieved at the time of activation of the transfer transistor.

An effect yielded by the above configuration is analogous to that yielded by the G pixel described in connection with the first embodiment, and hence its explanation is omitted.

As mentioned above, in addition to including the first photoelectric conversion area and the second photoelectric conversion area formed in the G pixel described in connection with the first embodiment, the solid-state imaging device of the present embodiment also has a first photoelectric conversion area having the form of a V-shaped trench and a second photoelectric conversion area having a flat structure with respect to the surface of the semiconductor substrate, both of which are formed in the photoelectric conversion area of the B pixel. The B pixel is generally said to be low in terms of sensitivity. Therefore, as described in connection with the present embodiment, the form of a V-shaped trench is adopted for the photoelectric conversion area of the B pixel, thereby enabling making of an attempt to enhance detection sensitivity to blue light. Further, the number of saturated electrons even in the B pixel can also be increased as in the case of the G pixel.

As in the case of the first embodiment, not adopting the form of a V-shaped trench for the photoelectric conversion area 201b of the R pixel 302 is also preferable even in the present embodiment. The reason for this is that, since infrared light having a wavelength of about 600 nm exhibits a small absorption coefficient in a semiconductor substrate, a portion of primary reflected light (oblique light) undergone primary reflection on the surface of the V-shaped trench passes through the photoelectric conversion area during the course of undergoing secondary reflection on the surface of the V-shaped trench; and that the thus-transmitted light enters an adjacent pixel and, by extension, photoelectric conversion areas of a plurality of far distant pixels. As a result, oblique red light is mixed into light (e.g., green light) detected by the pixel, which induces a failure of deterioration of color reproducibility.

Figure 13:
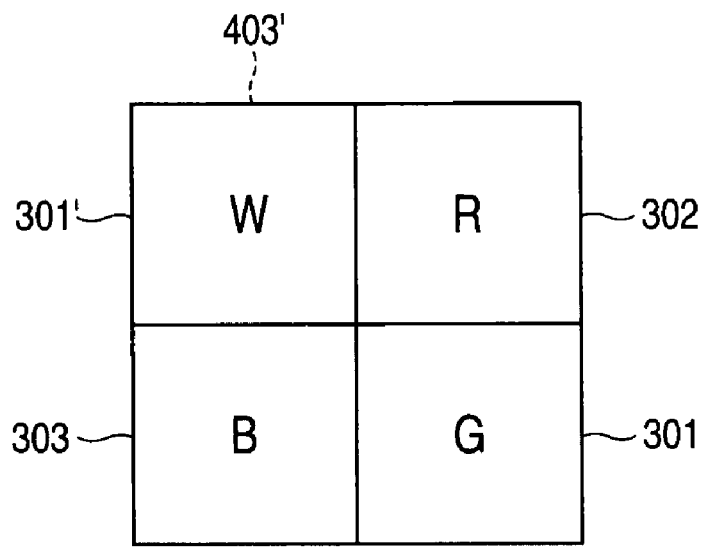
FIG. 13 is a planar view showing a pixel block according to another embodiment.

Incidentally, FIG. 13 shows an applicable configuration to the first and second embodiments as described above. Specifically, FIG. 13 shows an exemplified pixel block of two lines and tow rows, including the G pixel 301, the R pixel 302 and the B pixel 303. At a position diagonal to the G pixel 301, there is provided a W pixel (white pixel) 301' with a transparent filter 403d that is light-transmissive for all visible light wavelength range. The W pixel 301' may be formed in a flat shape, similar to the R pixel 302. By having such a configuration, high sensitivity can be achieved in the color imaging device.

Figure 14:
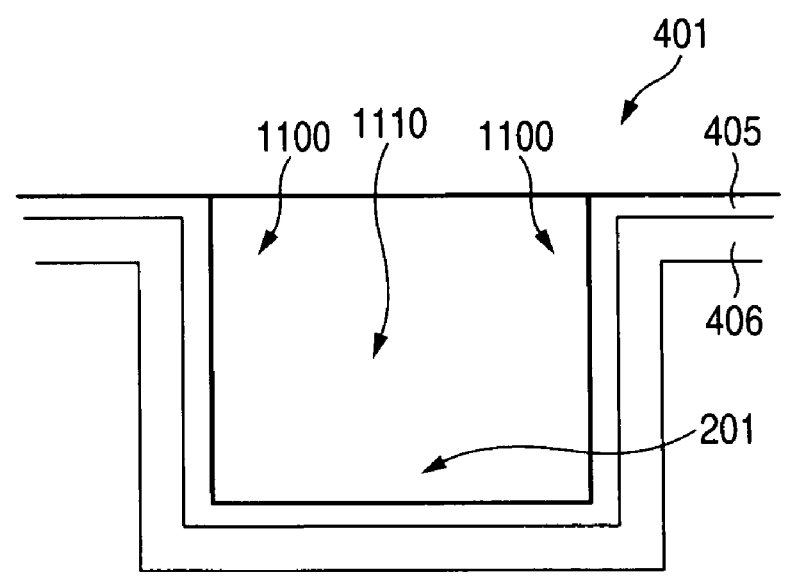
FIG. 14 is a cross-sectional profile showing a photoelectric conversion area according to another embodiment.

In the first and second embodiments, the photoelectric conversion area 201 is formed in a V-shaped trench formed on the semiconductor substrate 401. However, the embodiments are not limited to these configurations: As shown in FIG. 14, the photoelectric conversion area 201 may be formed in a trench 1110 of a rectangular cross-sectional shape, which is defined by steps 1100 formed on the surface of the semiconductor substrate 401.

Incidentally, the solid-state imaging device 100 as described in the first and second embodiments is applicable to an electronic apparatus, such as a digital camera.

What is claimed is:

1. A solid-state imaging device comprising:
a semiconductor substrate;
a first pixel formed on the semiconductor substrate, the first pixel having a first color filter that exhibits higher transmissivity to a first visible light wavelength range of a green color than to other visible light wavelength ranges;
a second pixel formed on the semiconductor substrate, the second pixel having a second color filter that exhibits higher transmissivity to a second visible light wavelength range of a blue color than to other visible light wavelength ranges; and a third pixel formed on the semiconductor substrate, the third pixel having a third color filter that exhibits higher transmissivity to a third visible light wavelength range of a red color than to other visible light wavelength ranges;

wherein the first pixel includes:
- a first area disposed in a first trench that is formed on a surface of the semiconductor substrate, the first area configured to generate an electric signal by photoelectric conversion, and
- a first transistor area that outputs the electric signal obtained from the first area as an output signal;

the second pixel includes:
- a second area disposed in a second trench that is formed on a surface of the semiconductor substrate, the second area configured to generate an electric signal by photoelectric conversion, and
- a second transistor area that outputs the electric signal obtained from the second area as an output signal; and the third pixel includes:
- a third area formed in a flat shape on the surface of the semiconductor substrate, the third area configured to generate an electric signal by photoelectric conversion, and
- a third transistor area that outputs the electric signal obtained from the third area as an output signal.

2. The device according to claim 1,
wherein the first pixel further includes a first flat area formed in a flat shape on the semiconductor substrate, the first flat area configured to generate an electric signal by photoelectric conversion;

the first flat area is disposed in proximity to the first area so that the first flat area and the first area are integrally formed in the same layer; and the first transistor area outputs the electric signal obtained in the first area and in the first flat are as the output signal.

3. The device according to claim 1,
wherein the second pixel further includes a second flat area formed in a flat shape on the semiconductor substrate, the second flat area configured to generate an electric signal by photoelectric conversion;

the second flat area is disposed in proximity to the second area so that the second flat area and the second area are integrally formed in the same layer; and the second transistor area outputs the electric signal obtained in the second area and in the second flat area as the output signal.

4. The device according to claim 2,
wherein the first flat area has a peak value of a dopant concentration higher than the first area;

the first transistor area includes a transfer transistor disposed adjacently to the first flat area; and the dopant concentration of the first flat area is determined to provide an electric potential that is lower than a channel potential achieved at the time of activation of the transfer transistor.

5. The device according to claim 3,
wherein the second flat area has a peak value of a dopant concentration higher than the second area;

the second transistor area includes a transfer transistor disposed adjacently to the second flat area; and the dopant concentration of the second flat area is determined such that an electric potential of the second flat area is lower than a channel potential achieved at the time of activation of the transfer transistor.

6. The device according to claim 4,
wherein the first area and the first flat area include a multilayer structure having a first dopant diffusion layer of first conductivity type and a second dopant diffusion layer of second conductivity type provided underneath the first dopant diffusion layer.

7. The device according to claim 5,
wherein the second area and the second flat area include a multilayer structure having a third dopant diffusion layer of first conductivity type and a fourth dopant diffusion layer of second conductivity type provided underneath the third dopant diffusion layer.

8. The device according to claim 1,
wherein the first trench and the second trench has cross sections in a V-shape.

9. The device according to claim 1,
wherein the first trench and the second trench has cross sections having a stepped shape.

10. The device according to claim 1,
wherein the first pixel, the second pixel and the third pixel are arranged in a matrix pattern.

11. The device according to claim 1, further comprising a fourth pixel formed on the semiconductor substrate, the fourth pixel having a transparent color filter.

* * * * *